(12) United States Patent
Chavali (10) Patent No.: US 11,721,632 B2
(45) Date of Patent: Aug. 8, 2023

(54) HYBRID CORE SUBSTRATE ARCHITECTURE FOR HIGH SPEED SIGNALING AND FLI/SLI RELIABILITY AND ITS MAKING

(71) Applicant: Intel Corporation, Santa Clara, CA (US)

(72) Inventor: Sri Chaitra Jyotsna Chavali, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 771 days.

(21) Appl. No.: 16/665,644

(22) Filed: Oct. 28, 2019

(65) Prior Publication Data

US 2021/0125932 A1 Apr. 29, 2021

(51) Int. Cl.
*H01L 23/538* (2006.01)
*H01L 21/48* (2006.01)
(Continued)

(52) U.S. Cl.
CPC ........ *H01L 23/5386* (2013.01); *H01L 21/486* (2013.01); *H01L 21/4846* (2013.01); *H01L 21/4853* (2013.01); *H01L 21/4857* (2013.01); *H01L 23/49811* (2013.01); *H01L 23/49822* (2013.01); *H01L 23/49827* (2013.01); *H01L 23/49838* (2013.01); *H01L 23/5381* (2013.01); *H01L 23/5384* (2013.01); *H01L 23/5385* (2013.01); *H01L 23/562* (2013.01);
(Continued)

(58) Field of Classification Search
CPC ......... H01L 23/49838; H01L 23/49811; H01L 24/16; H01L 21/4853; H01L 21/486; H01L 21/4857; H01L 21/4846; H01L 23/5386; H01L 23/5381; H01L 23/5384; H01L 23/5385; H01L 23/562; H01L 23/49827; H01L 23/49822
See application file for complete search history.

(56) References Cited

U.S. PATENT DOCUMENTS

6,370,012 B1 * 4/2002 Adae-Amoakoh .......................... H01L 23/49822 361/306.3
2003/0002260 A1 * 1/2003 Hasebe ............. H01L 23/49833 361/720
(Continued)

*Primary Examiner* — Alonzo Chambliss
(74) *Attorney, Agent, or Firm* — Schwabe, Williamson & Wyatt P.C.

(57) ABSTRACT

Embodiments include a package substrate, a semiconductor package, and a method of forming the package substrate. A package substrate includes a core substrate between a first alternate core substrate and a second alternate core substrate. The first alternate core substrate includes conductive layers and vias. The package substrate includes a dielectric layer surrounding the core and first and second alternate substrates, a first conductive layer on a top surface of the dielectric layer, and a second conductive layer on top surfaces of the core and first and second alternate substrates, where the dielectric layer is over/under the core and first and second alternate substrates. The package substrate includes a third conductive layer on bottom surfaces of the core and first and second alternate substrates. The conductive layers are coupled to the vias within the first alternate core substrate, where the conductive layers and vias couple the second and third layers.

25 Claims, 5 Drawing Sheets

(51) Int. Cl.
*H01L 23/498* (2006.01)
*H01L 23/00* (2006.01)
(52) U.S. Cl.
CPC .... *H01L 24/16* (2013.01); *H01L 2224/16227* (2013.01); *H01L 2924/351* (2013.01)

(56) References Cited

U.S. PATENT DOCUMENTS

| | | | |
|---|---|---|---|
| 2012/0199386 A1* | 8/2012 | Adachi | H05K 3/445 174/258 |
| 2012/0247818 A1* | 10/2012 | Adachi | H05K 3/445 174/257 |
| 2013/0133926 A1* | 5/2013 | Kim | H05K 3/4673 174/250 |
| 2016/0163614 A1* | 6/2016 | Chen | H01L 21/4846 257/774 |
| 2016/0205780 A1* | 7/2016 | Lee | H05K 3/4038 174/257 |

* cited by examiner

HYBRID CORE SUBSTRATE ARCHITECTURE FOR HIGH SPEED SIGNALING AND FLI/SLI RELIABILITY AND ITS MAKING

FIELD

Embodiments relate to packaging electronic devices. More particularly, the embodiments relate to electronic devices with hybrid core substrate architectures for high-speed signaling and first-level and second-level interconnects reliability.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as with high-speed package substrates, while optimizing the performance of each device, however is not without issue.

As the speeds and bandwidths of packages increase from generation to generation, the numbers of computing devices (or IP blocks) that need to interact from these package to motherboards and back and forth will increase (e.g., such routing schemes include peripheral component interconnect express generation X (PCIe genX) lanes, serializer/deserializer (SERDES), etc.). This leads existing technologies to incorporate substantially thick dielectrics and skip layers and design added layers and complex routing schemes in order to meet the ever-increasing performance requirements. Furthermore, past routing schemes add to the routing complexity of non-high-speed signaling and lateral power delivery due to discontinuities in the metal plane of a given layer of such complex routing schemes.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages with hybrid core substrate architectures and methods of forming such semiconductor packages. The semiconductor packages described below and methods of forming such semiconductor packages may include a plurality of dies, a bridge, and a package substrate, according to some embodiments. The embodiments described herein may implement the package substrate as a hybrid core package substrate that includes a core substrate and an alternate substrate. In these embodiments, such hybrid core package substrate described herein may be implemented for high-speed signaling and first-level interconnects (FLIs) and second-level interconnects (SLIs) reliability.

As used herein, a "hybrid core package substrate" may refer to a hybrid core substrate architecture that implements (or combines) a core substrate with an alternate core substrate, where the alternate core substrate provides additional routing capabilities by opening up and disposing (or forming) multiple layers within the alternate core substrate itself. Additionally, as used herein, an "alternate core substrate" may refer to a plurality of routing schemes comprised of thin conductive layers and vias that are disposed within a core substrate or the like. That is, the alternate core substrate described herein may be implemented with a stacked via laminate core substrate, a multi-laminate core substrate, a flip-chip ball-grid array/chip-scale package (BGA/CSP) substrate, a ceramic/glass core substrate, and/or any other similar core substrate materials.

The embodiments described herein provide improvements to existing packaging solutions by enabling routing schemes implemented with thin (or ultrathin) routing layers within the thickness of the alternate core substrate, while adding additional routing layers to the package substrate—without needing to increase (i) the overall thickness (or z-height) of the package substrate, and (ii) the routings (or FLIs) on the top layer of the package substrate. For example, such embodiments enable the build-up layers of the package substrate to maintain a substantially low thickness by opening up (or implementing) additional routing layers through/ within the core thickness of the alternate core substrate instead of disposing such additional routing layers in the build-up layers of the package substrate. These embodiments also enable increasing the high-speed signaling and bandwidth of the package substrate without requiring additional routing layer pairs and complex routing schemes. Furthermore, the embodiments of the semiconductor packages described below may implement the hybrid core package substrate to provide thermo-mechanical relief on the SLIs without sacrificing the reliability on the FLIs, and to improve the backside routings while reducing the stresses on such routings.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with dies, bridges, and hybrid core package substrates that include core substrates, alternate core substrates, conductive layers and via, dielectric layers, and solder resist layers.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1:
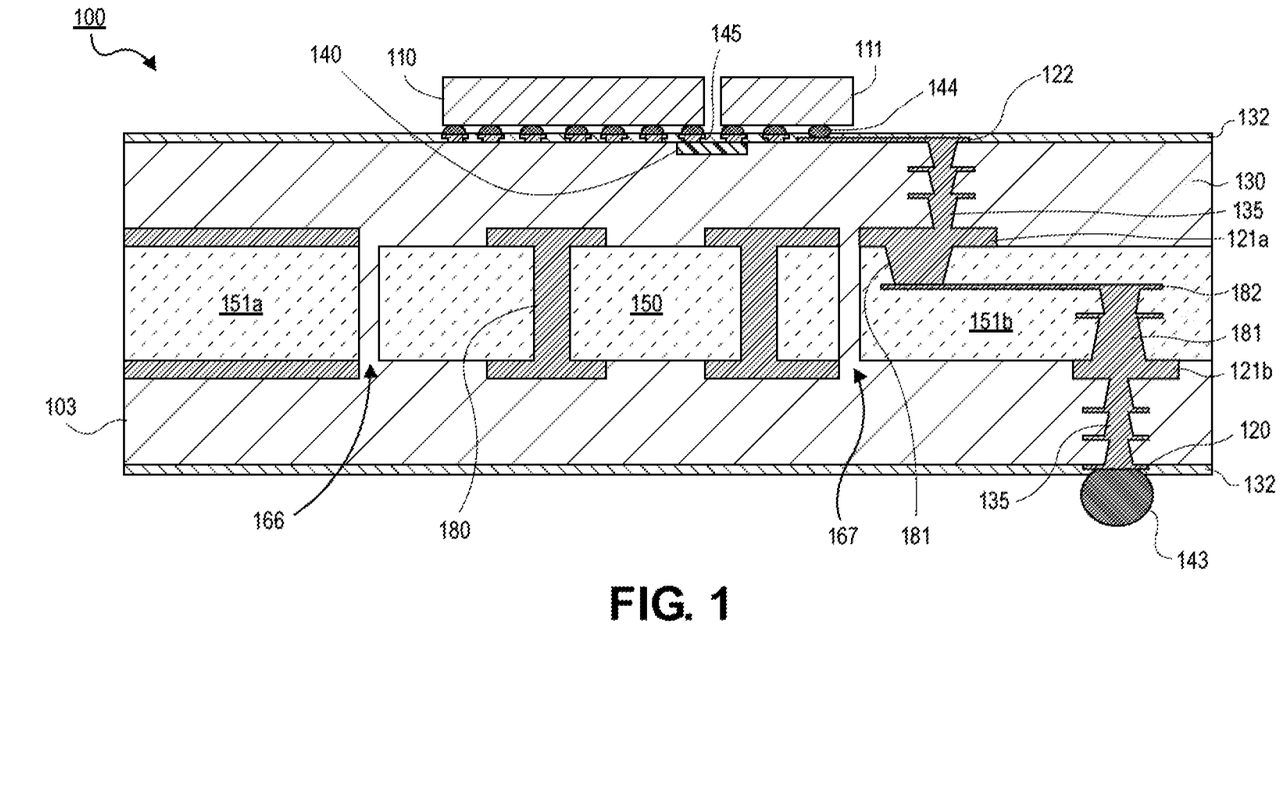
FIG. 1 is an illustration of a cross-sectional view of a semiconductor package with a plurality of dies and a package substrate, where the package substrate has a core substrate and a plurality of alternate core substrates, according to one embodiment.

Referring now to FIG. 1, a cross-sectional illustration of a semiconductor package 100 is shown, in accordance with an embodiment. In an embodiment, the semiconductor package 100 may include a plurality of dies 110-111, a bridge 140, and a package substrate 103. For one embodiment, the dies 110-111 may be disposed on the package substrate 103. In some embodiments, the bridge 140 may be embedded in the package substrate 103 to conductively (and/or communicatively) couple the die 110 (or the first die) to the die 111 (or the second die). For example, the bridge 140 may be coupled to a plurality of conductive pads 145 that are also conductively coupled to a plurality of solder balls 144 of the dies 110-111. Note that the semiconductor package 100 is not limited to the illustrated semiconductor packaged system, and thus may be designed/formed with fewer, alternate, or additional packaging components and/or with different interconnecting structures.

According to one embodiment, the semiconductor package 100 is merely one example of an embodiment of a semiconductor packaged system. For one embodiment, the semiconductor package 100 may include a BGA package, a land grid array (LGA) package, and/or a pin grid array (PGA) package. For one embodiment, as described above, the dies 110-111 and the bridge 140 may be coupled to the package substrate 103 via the solder balls 144 that may be implemented as solder bumps/joints formed from respective microbumps. A solder joint formed by soldering of a microbump according to an embodiment may itself be referred to as a "bump" and/or a "microbump." Additionally, for other embodiments, the dies 110-111, the bridge 140, and the package substrate 103 may be coupled using an anisotropic conductive film (ACF) or the like.

For one embodiment, the package substrate 100 may include, but is not limited to, a package, a substrate, a printed circuit board (PCB), and a motherboard. For one embodiment, the package substrate 100 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include a resist layer 132 and a dielectric layer 130, where the resist layer 132 may be a solder resist mask (or layer), and the dielectric layer 130 may be a photosensitive dielectric layer. For one embodiment, the PCB 100 may also include a plurality of conductive layers 120, 121a-b, and 122 and a plurality of vias 135, which may further include copper (or metallic) traces, lines, pads, vias, via pads, holes, and/or planes.

For one embodiment, the dies 110-111 may include, but are not limited to, a semiconductor die, an electronic device (e.g., a wireless device), an integrated circuit (IC) (e.g., a serializer/deserializer (SERDES)), a central processing unit (CPU), a microprocessor, a platform controller hub (PCH), a memory, and/or a field-programmable gate array (FPGA). The dies 110-111 may be formed from a material such as silicon and have circuitry thereon that is to be coupled to the package substrate 103. Although some embodiments are not limited in this regard, the package substrate 103 may in turn be coupled to another body, for example, a computer motherboard (or the like) with one or more solder balls 143. One or more connections between the package substrate 103, the dies 110-111, and the bridge 140—e.g., including some or all of bumps 143-144—may include one or more interconnect structures and underfill layers if desired. In some embodiments, these interconnect structures (or connections) may variously comprise an alloy of nickel, palladium, and tin (and, in some embodiments, copper). For one embodiment, the underfill layers may be one or more polymer materials that are injected between the respective components. For other embodiments, the underfill layers may be molded underfills (MUF).

Connections between the package substrate 103 and another body may be made using any suitable structure, such as the illustrative solder bumps 143 shown. The package substrate 103 may include a variety of electronic structures formed thereon or therein. For one embodiment, one or more different materials may be used for forming the package substrate 103, including, for example, a core substrate 150, an alternative core substrates 151a-b, and so on. In certain embodiments, the package substrate 103 is an organic substrate made up of one or more layers of polymer base material, with conducting regions for transmitting signals.

In some embodiments, the bridge 140 (or the bridge die) may be disposed directly below the dies 110-111. The bridge 140 may have conductive pads 145 that are coupled to the dies 110-111 with the solder balls 144. In an embodiment, the bridge 140 may be a silicon bridge or a bridge made of any other substrate material that is suitable for forming bridges. In one embodiment, the bridge 140 may be an embedded multi-die interconnect bridge (EMIB). In an embodiment, the bridge 140 may have a plurality of interconnects such as through-silicon vias (TSVs). In an embodiment, the bridge 140 may be embedded in the package substrate 103. In one embodiment, the dielectric layer 130 of the package substrate 103 may embed (or surround) the bridge 140.

Furthermore, as described above, the package substrate 103 may be a hybrid core package substrate. In some embodiments, the package substrate 103 may include a core substrate 150 (or a first core substrate) and a plurality of alternate core substrates 151a-b (or a second core substrate, a third core substrate, etc.). In these embodiments, the core substrate 150 may be disposed (or positioned/located) between the alternate core substrates 151a-b. For one embodiment, the dielectric layer 130 may surround (or embed) the core substrate 150 and the alternate core substrates 151a-b. In some embodiments, a plurality of openings 166-167 (or gaps) may separate and be disposed between the core substrate 150 and the respective alternate core substrates 151a-b. For some embodiments, as shown in FIG. 1, the openings 166-167 may be disposed (or filled) with the dielectric layer 130. While, in other embodiments, as shown in FIG. 2F, the openings 166-167 may be disposed (or plugged) with a plurality of plugs or the like. For example, the openings 166-167 (or gaps) may be filled with the plugs, which may be formed of any organic polymer materials, and/or filled with the dielectric layer 130, which may be disposed above and below the respective core and alternate core substrates 150 and 151a-b, and which may also be disposed into the openings 166-167 between such respective core and alternate core substrates 150 and 151a-b to form the illustrated sandwich structure of the package substrate 103.

For one embodiment, the core substrate 150 may be a cored substrate comprised of glass (or glass fiber) materials, magnetic materials, organic materials, and/or the like. In some embodiments, the core substrate 150 may include one or more materials such as epoxy, glass (or glass fibers), and/or the like. For example, the core substrate 150 may be a glass fiber reinforced core substrate. In some embodiments, the core substrate 150 may have a thickness of approximately 18 um to 1.5 mm. In another embodiment, the core substrate 150 may have a thickness of approximately 1.5 mm or greater. For some embodiments, the core substrate 150 may have a thickness that is substantially equal to a thickness of the alternate core substrates 151a-b. In another embodiment, the core substrate 150 may have a thickness that is different than a thickness of the alternate core substrates 151a-b.

According to some embodiments, the core substrate 150 may include a plurality of plated-through hole (PTH) vias 180 that are coupled to the conductive layers 121a-b. For example, the PTH vias 180 may vertically extend from the bottom surface to the top surface of the core substrate 150. In one embodiment, the conductive pad of the conductive layer 121a may be disposed directly over the top surfaces of the core substrate 150 and the PTH vias 180, while the conductive pad of the conductive layer 121b may be disposed directly under the bottom surfaces of the core substrate 150 and the PTH vias 180.

In some embodiments, the PTH vias 180 and the conductive layers 121a-b may be comprised of a conductive material such as a metal (e.g., copper) and/or the like. In one embodiment, the PTH vias 180 may be implemented by a laser/drilling process (i.e., a laser through hole (LTH) process), an electroless deposition process, and/or the like to pattern/form the via openings, vias, conductive pads, conductive sidewalls, and so on, into/on the core substrate 150. For one embodiment, the PTH vias 180 may be laser-plated vias formed with any convention process, including, for example, an electroless plating process or the like. In some embodiments, the PTH vias 180 of the core substrate 150 may be utilized to supply power to the die 110 (or the central CPU die).

In some embodiments, the alternate core substrates 151a-b may be a single alternate core substrate that is pre-patterned into the alternate core substrate 151a and the alternate core substrate 151b (e.g., as shown with the alternate core substrate 251 of FIG. 2A into the alternate core substrates 251a-b of FIG. 2B), where the core substrate 150 is disposed between the alternate core substrate 151a from the alternate core substrate 151b. For one embodiment, the alternate core substrates 151a-b may be a stacked via laminate core substrate, a multi-laminate core substrate, a flip-chip BGA/CSP substrate, a ceramic/glass core substrate, and/or any other core substrate. In an embodiment, the alternate core substrate 151a may be substantially similar to the alternate core substrate 151b, with the exception that the alternate core substrate 151b may include one or more conductive layers 181 and vias 182 disposed within the core of the alternate core substrate 151b. In other embodiments, the alternate core substrates 151a-b may be patterned with the same routing scheme and to be substantially similar to each other.

As described above, in some embodiments, the alternate core substrates 151a-b may provide additional routing capabilities to the package substrate 103 by implementing the conductive layers 182 and vias 181 within the alternate core substrate 151b. The alternate core substrates 151a-b may be patterned with any number of routing schemes based on the desired packaging design and/or application (i.e., these routing schemes may be implemented based on the desired requirements without any design rules). For example, the alternate core substrate 151b may be implemented with any desired number of conductive layers 182 and vias 181 within the core thickness of the alternate core substrate 151b.

Accordingly, the package substrate 103 enables routings within the core(s) of the alternate core substrates 151a-b and outside of the area/shadow of the die 110 (or the main central CPU area/shadow)—without affecting the power delivery circuitry located under such die 110 area/shadow. Also, the alternate core substrates 151a-b provides a heightened isolation between the SERDES signal line and the ground (GND) plane of the package substrate 103. That is, based on the core thicknesses within server/high performance computing segments of the core and alternate core substrates 150 and 151a-b, the package substrate 103 may implement multiple layers of ground isolation for the SERDES routing within the core thicknesses of the alternate core substrates 151a-b.

For some embodiments, the alternate core substrates 151a-b may provide a reduced coefficient of thermal expansion (CTE) for the FLIs and the SLIs of the package substrate 103, while also providing this reduced CTE at the respective corners of the package substrate 103. For example, the routing schemes of the alternate core substrates 151a-b may minimize the stresses of the FLIs, the SLIs, the solder joint reliability (SJR), and the integrated heat spreader (IHS) sealant of the package substrate 103. Note that, in some embodiments, the FLI stresses of the package substrate 103 may be controlled to a minimum value by locally disposing (or positioning) the core substrate 150 under the die shadow of the die 110.

In some embodiments, the alternate core substrates 151a-b may have a thickness of approximately 18 um to 1.5 mm. In another embodiment, the core substrate 150 may have a thickness of approximately 1.5 mm or greater. For some embodiments, the alternate core substrate 151a may have a thickness that is substantially equal to a thickness of the alternate core substrate 151b. In another embodiment, the alternate core substrate 151a may have a thickness that is different than a thickness of the alternate core substrate 151b. Additionally, in one embodiment, the alternate core substrates 151a-b may have a thickness that is substantially equal to a thickness of the core substrate 150, while, in another embodiment, the alternate core substrates 151a-b may have a thickness that is substantially equal to a thickness of the core substrate 150.

As described above, the hybrid core substrate architecture of the package substrate 103 provides the flexibility to route signals within the alternate core substrates 151a-b until the BGA ball pin-out 'X-Y' location, before translating vertically downwards as a stacked via with the vias 135 that are coupled to the conductive layers 120 and 121b. Likewise, in these embodiments, the package substrate 103 may implement the conductive layers 121a and 122 and the vias 135 to conductively couple the alternate core substrate 151b to the dies 110-111 and the bridge 140, where the conductive layer 122 may be implemented as the FLIs, and the conductive layer 121a may be implemented as the SLIs.

Note that, in some alternative embodiments, the package substrate 103 may conductively couple the core substrate 150 to the alternate core substrate 151a and/or the alternate core substrate 151b via one or more conductive routings that may be implemented above and/or below the core substrate 150 and the alternate core substrates 151a-b. Also note that even if one set of stacked vias 135 with the conductive layers 120, 121a-b, and 122 are illustrated in FIG. 1 for simplicity, it should be understood that any number of stacked vias and conductive layers, pads, traces, planes, etc., may be implemented and coupled within the package substrate 103.

Note that the semiconductor package 100 may include fewer or additional packaging components based on the desired packaging design.

FIGS. 2A-2F are illustrations of cross-sectional views of a process flow to form a semiconductor package 200 with a package substrate 203 that has a core substrate 250 and an alternate core substrates 251a-b, according to some embodiments. The process flow illustrated in FIGS. 2A-2F forms the semiconductor package 200 that is substantially similar to the semiconductor package 100 described above in FIG. 1. Likewise, the components of the semiconductor package 200 are substantially similar to the components of the semiconductor package 100 described above in FIG. 1.

Accordingly, as described above, the process flow of the semiconductor package 200 illustrates one of the approaches to implement a hybrid core substrate architecture with the package substrate 203 comprised of the core substrate 250 disposed between the alternative core substrates 251a-b, where such hybrid core substrate architecture enables increased high-speed signaling, improved FLIs/SLIs reliability, additional routing layers within the core(s) of the alternate core substrates 251a-b, improved backside routings, and additional thermo-mechanical relief on the SLIs without sacrificing the improved reliability of the FLIs.

Figure 2A:
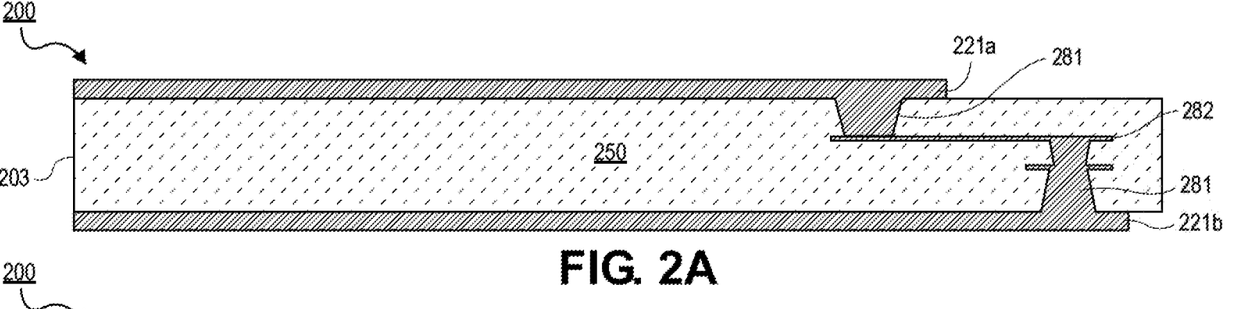
FIGS. 2A-2F are illustrations of cross-sectional views of a process flow to form a semiconductor package with a package substrate that has a core substrate and a plurality of alternate core substrates, according to some embodiments.

Referring now to FIG. 2A, a cross-sectional illustration of a semiconductor package 200 is shown, in accordance with an embodiment. In an embodiment, the semiconductor package 200 may include a package substrate 203 with an alternate core substrate 250. The package substrate 203 and the alternate core substrate 250 may be substantially similar to the package substrate 103 and the alternate core substrates 151a-b described above in FIG. 1, with the exception that the alternate core substrate 250 may be implemented to initially form (or pre-pattern) the illustrated conductive routings including the conductive layers 221a-b, the conductive layer 282, and the vias 281. In one embodiment, the alternate core substrate 250 may have the conductive layer 221a disposed on the top surface, and the conductive layer 221b disposed on the bottom surface, where the conductive layers 221a-b may be coupled with the conductive layer 282 and the vias 281 that are implemented within the core itself. The conductive layers 221a-b, the conductive layer 282, and the vias 281 may be substantially similar to the conductive layers 121a-b, the conductive layer 182, and the vias 181 described above in FIG. 1.

Figures 2B, 2C:
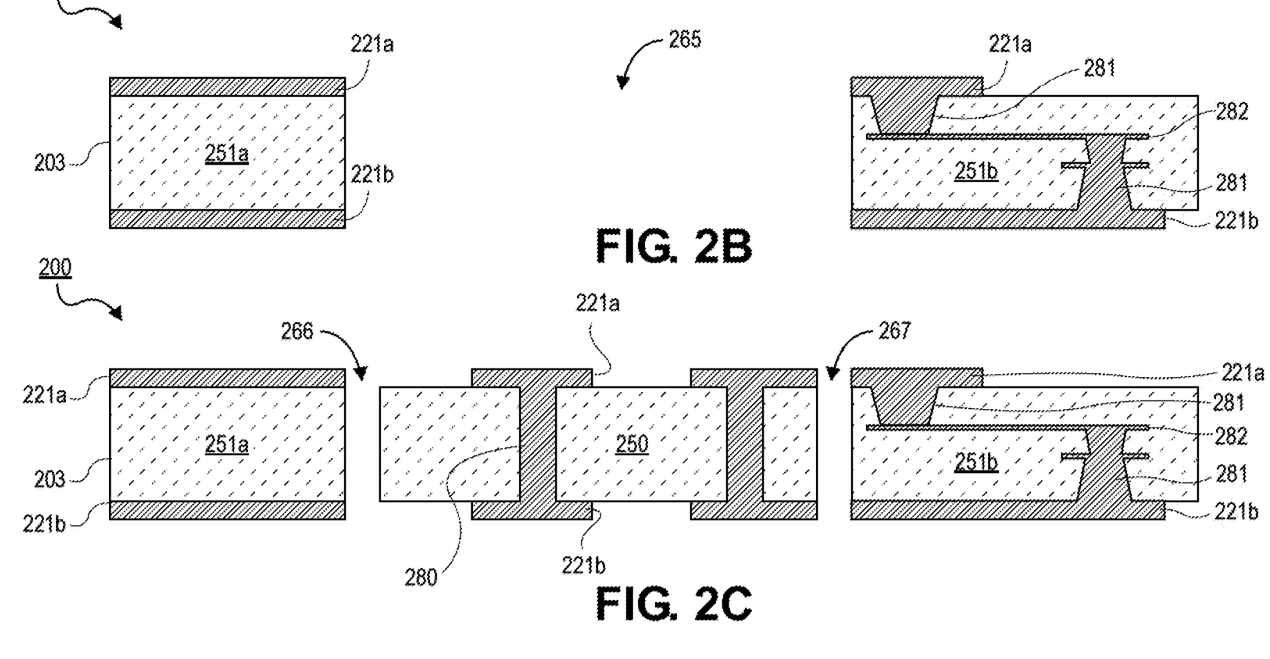

Referring now to FIG. 2B, a cross-sectional illustration of a semiconductor package 200 is shown, in accordance with an embodiment. In an embodiment, an opening 265 may be patterned into the initial alternate core substrate (as shown in FIG. 2A) to form an alternate core substrate 251a and an alternate core substrate 251b, where the patterned opening 265 may be used to separate the alternate core substrate 251a from the alternate core substrate 251b. The alternate core substrates 251a-b may be substantially similar to the alternate core substrates 151a-b described above in FIG. 1. For some embodiments, the opening 265 may be implemented to have a specified width between the alternate core substrates 251a-b that may be subsequently used to house a core substrate (as shown below in FIG. 2C).

Referring now to FIG. 2C, a cross-sectional illustration of a semiconductor package 200 is shown, in accordance with an embodiment. In an embodiment, a core substrate 250 may be disposed into the initial opening and disposed between the alternate core substrates 251a-b, where the core substrate 250 may include a plurality of PTH vias 280 coupled to the conductive layers 221a-b. The core substrate 250 and the PTH vias 280 may be substantially similar to the core substrate 150 and the PTH vias 180 described above in FIG. 1. In some embodiments, the PTH vias 280 of the core substrate 250 may be implemented to subsequently supply power to a main central CPU die (e.g., as shown with the die 110 of FIG. 1). Also, as shown in FIG. 2C, after the core substrate 250 is disposed into the initial opening, a plurality of openings 266-267 (or gaps) may be formed between the core substrate 250 and the respective alternate core substrates 251a-b, where the openings 266-267 may thus separate the core substrate 250 from the respective alternate core substrates 251a-b.

Figure 2D:
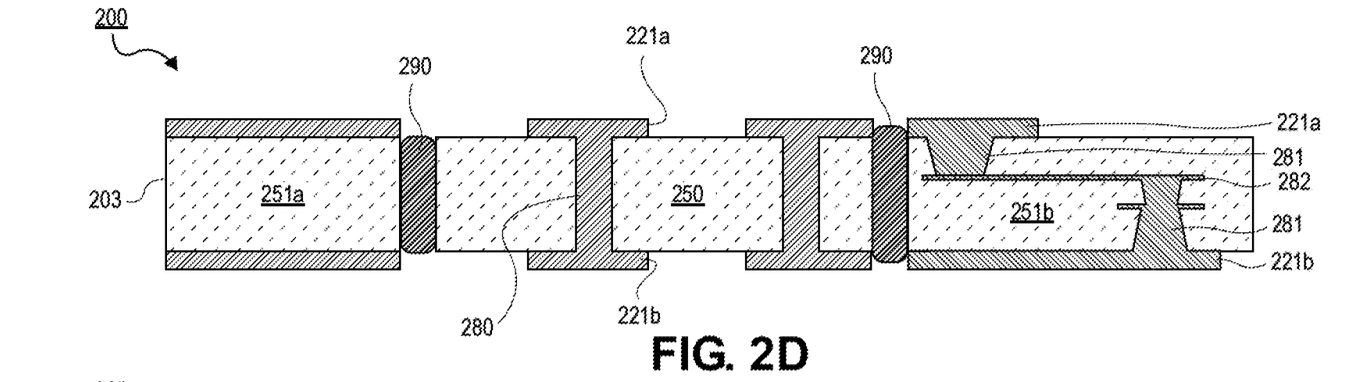

Referring now to FIG. 2D, a cross-sectional illustration of a semiconductor package 200 is shown, in accordance with an embodiment. In an embodiment, the semiconductor package 200 may include a plurality of plugs 290 disposed into the openings formed between the core substrate 250 and the alternate core substrates 251a-b. In one embodiment, the plugs 290 may be formed of one or more materials such as dielectric materials, encapsulation/mold materials, and/or the like. In other embodiments, the plugs 290 may be comprised of one or more organic polymer materials.

Also note that, in other embodiments, the plugs 290 may be omitted (e.g., as shown in FIG. 1), where such openings between the core substrate 250 and the alternate core substrates 251a-b may be filled with a dielectric layer (or material). For example, the openings 266-267 (or gaps) may be filled with the plugs 290 and/or filled with the dielectric layer (e.g., the dielectric layer 230 of FIG. 2E), which may be disposed above and below the respective core and alternate core substrates 250 and 251a-b, and which may also be disposed into the openings 266-267 between such respective core and alternate core substrates 250 and 251a-b to form the illustrated sandwich structure of the package substrate 203.

Figure 2E:
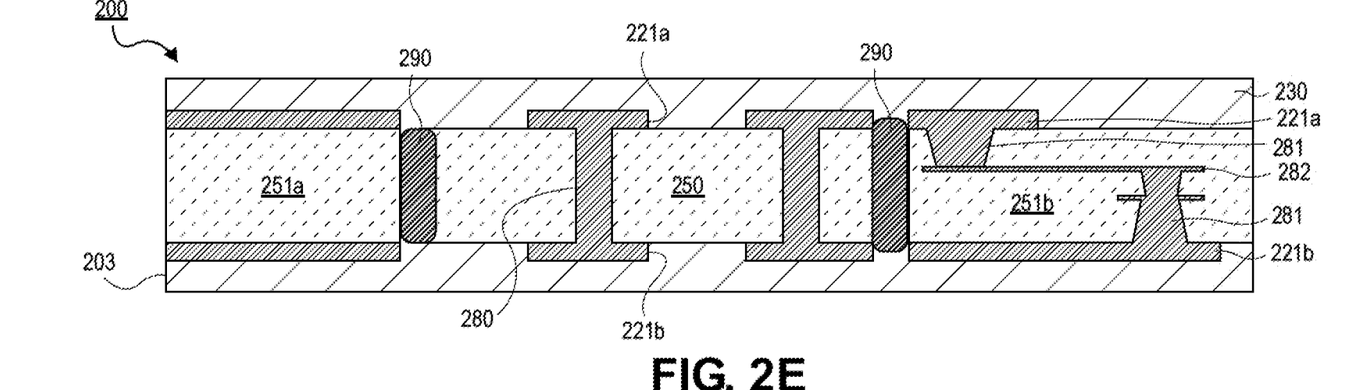
Figure 2F:
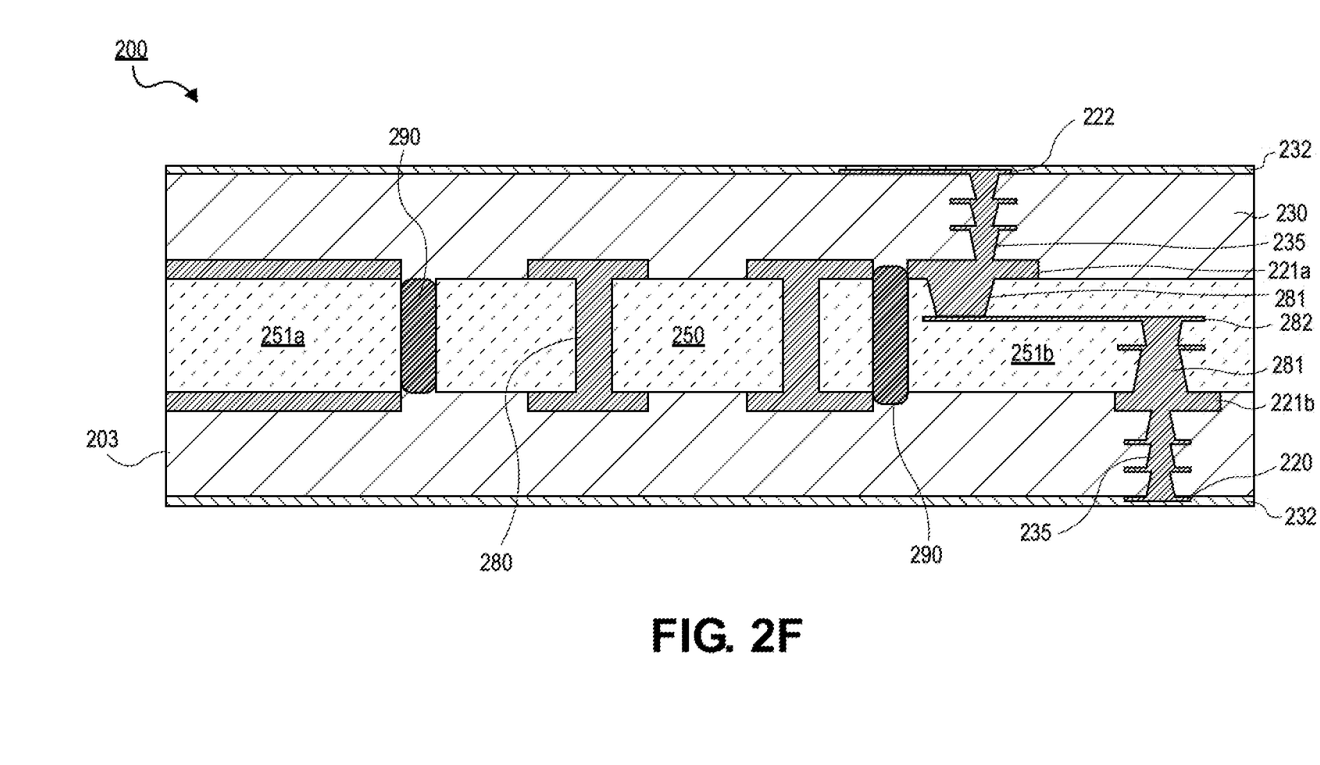

Referring now to FIG. 2E, a cross-sectional illustration of a semiconductor package 200 is shown, in accordance with an embodiment. In an embodiment, a dielectric layer 230 may be disposed over/under and around the core substrate 250, the alternate core substrates 251a-b, the conductive layer 221a-b, and the plugs 290. The dielectric layer 230 may thus surround the core substrate 250 and the alternate core substrates 251a-b. In one embodiment, the dielectric layer 230 be implemented (or deposited) with a lamination and curing process (or a two-sided lamination and curing process) or the like. Additionally, in another embodiment, the dielectric layer 230 may be planarized with a polishing/grinding process or the like. The dielectric layer 230 may be substantially similar to the dielectric layer 130 described above in FIG. 1.

Referring now to FIG. 2F, a cross-sectional illustration of a semiconductor package 200 is shown, in accordance with an embodiment. In an embodiment, a plurality of vias 235 and a plurality of conductive layers 220 and 222 may be disposed into the package substrate 203, where the vias 235 may be stacked on top of each other and/or on top of the conductive layers 220, 221a-b, and 222. In some embodiments, as shown in FIG. 2F, one set of stacked vias 235 may be implemented to conductively couple the conductive layer 221a of the alternate core substrate 251b to the conductive layer 222, while another set of stacked vias 235 may be implemented to conductively couple the conductive layer 221b of the alternate core substrate 251b to the conductive layer 220. Additionally, in some embodiments, a plurality of resist layers 232 may be disposed on the top and bottom surfaces of the package substrate 203, where the resist layers 232 may surround the respective conductive layers 220 and 222.

The vias 235, the conductive layers 220 and 222, and the resist layers 232 may be substantially similar to the vias 135, the conductive layers 120 and 122, and the resist layers 132 described above in FIG. 1. In some embodiments, the vias 235 and the conductive layers 220 and 222 may be implemented (or formed) with one or more processes such as a lamination process, a laser process, a lithographic process, and/or the like. In additional embodiments, a plurality of dies and/or bridges (or other electronic devices) may be disposed on the package substrate 203 and coupled onto the conductive layer 222 (e.g., as shown with the dies 110-111 and the bridge 140 of FIG. 1). Thereby, such dies and bridges may be conductively coupled to the package substrate 203 through the conductive routings of the alternate core substrate 251a, the alternate core substrate 251b, and/or the core substrate 250, where these conductive routings may thus couple the respective dies and/or bridges to any other additional substrate (e.g., a motherboard) via the conductive layer 220 and one or more solder balls (e.g., as shown with the conductive layer 120 and the solder ball 143 of FIG. 1).

Note that the semiconductor package 200 of FIGS. 2A-2F may include fewer or additional packaging components based on the desired packaging design.

Figure 3:
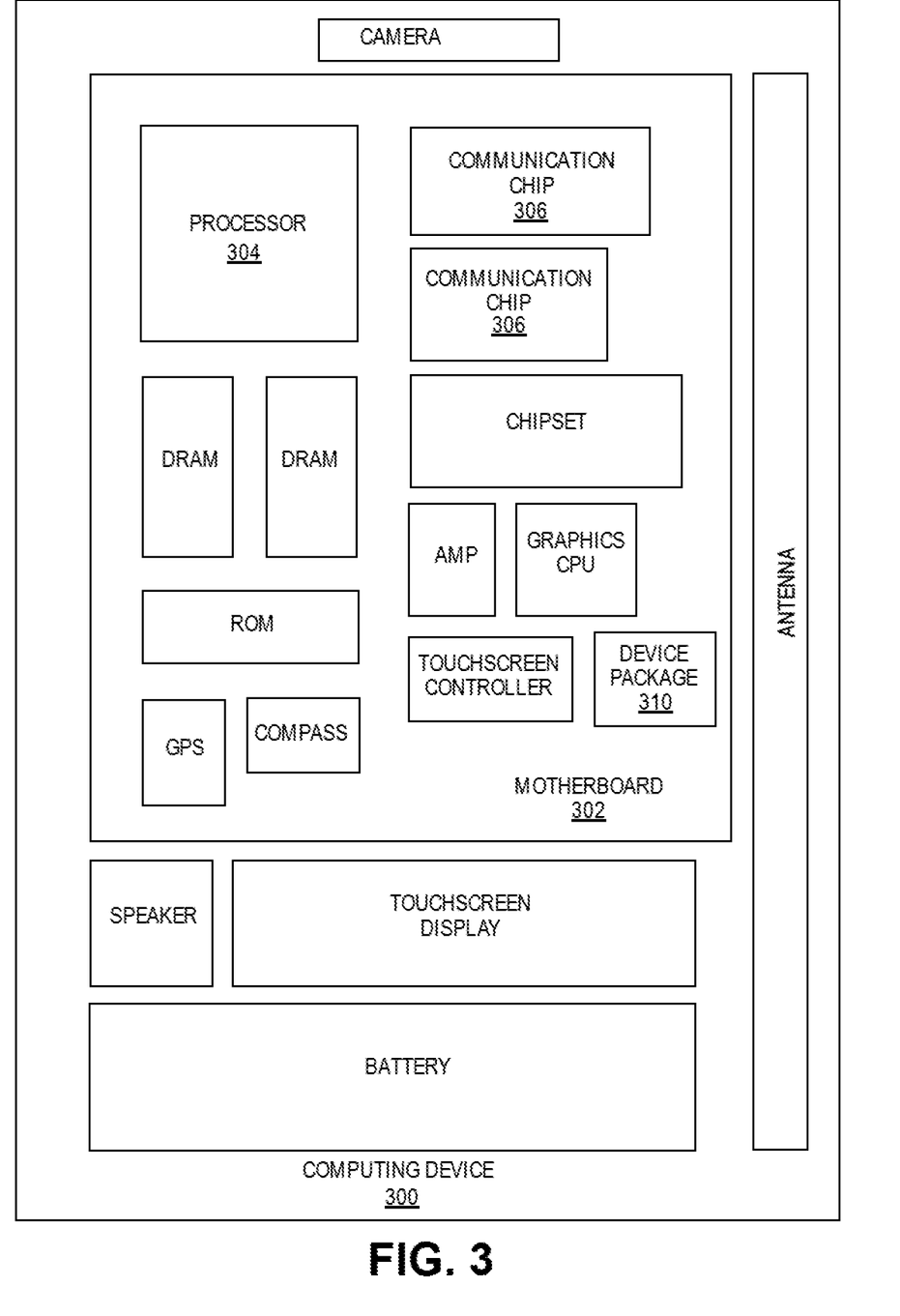
FIG. 3 is an illustration of a schematic block diagram illustrating a computer system that utilizes a device package with a plurality of dies and a package substrate, where the package substrate has a core substrate and a plurality of alternate core substrates, according to one embodiment.

FIG. 3 is an illustration of a schematic block diagram illustrating a computer system 300 that utilizes a device package 310 (or a semiconductor package) with a plurality of dies and a package substrate that has a core substrate and a plurality of alternate core substrates, according to one embodiment. FIG. 3 illustrates an example of computing device 300. Computing device 300 houses a motherboard 302. Motherboard 302 may include a number of components, including but not limited to processor 304, device package 310 (or semiconductor package), and at least one communication chip 306. Processor 304 is physically and electrically coupled to motherboard 302. For some embodiments, at least one communication chip 306 is also physically and electrically coupled to motherboard 302. For other embodiments, at least one communication chip 306 is part of processor 304.

Depending on its applications, computing device 300 may include other components that may or may not be physically and electrically coupled to motherboard 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 306 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. Device package 310 may be a semiconductor package or the like. Device package 310 may include, but is not limited to, a substrate, a package substrate, and/or a PCB. In one embodiment, device package 310 may be substantially similar to the semiconductor packages 100 and 200 of FIGS. 1 and 2A-2F described herein. Device package 310 may a plurality of dies, a bridge, and a package substrate, where the dies and bridge may be coupled to the package substrate. Device package 310 may implement the package substrate with a core substrate, a plurality of alternate core substrates, and a plurality of conductive layers and vias, where the alternate core substrates may provide additional routing layers (or routing schemes) within the cores of the alternate core substrates itself as described herein (e.g., as illustrated and described above with the alternate core substrates 151a-b and 251a-b of FIGS. 1 and 2A-2F)—or any other components from the figures described herein.

Note that device package 310 may be a single component/device, a subset of components, and/or an entire system, as the materials, features, and components may be limited to device package 310 and/or any other component of the computing device 300 that may need the alternate core substrates as described herein (e.g., the motherboard 302, the processor 304, and/or any other component of the computing device 300 that may need the embodiments of the alternate core substrates of the semiconductor packages described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 306 also includes an integrated circuit die packaged within the communication chip 306. For some embodiments, the integrated circuit die of the communication chip 306 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising: a core substrate between a first alternate core substrate and a second alternate core substrate, wherein the first alternate core substrate includes a plurality of conductive layers and a plurality of vias; a dielectric layer surrounds the core substrate and the first and second alternate substrates, wherein the dielectric layer is over and under the core substrate and the first and second alternate substrates; a first conductive layer on a top surface of the dielectric layer; a second conductive layer on top surfaces of the core substrate and the first and second alternate substrates; and a third conductive layer on bottom surfaces of the core substrate and the first and second alternate substrates, wherein the plurality of conductive layers are coupled to the plurality of vias within the first alternate core substrate, and wherein the plurality of conductive layers and vias couple the second layer to the third layer.

In example 2, the subject matter of example 1 can optionally include that the core substrate has a thickness that is substantially equal to a thickness of the first and second alternate core substrates.

In example 3, the subject matter of examples 1-2 can optionally include that the plurality of conductive layers and vias vertically extend from the bottom surface of the first alternate core substrate to the top surface of the first alternate core substrate.

In example 4, the subject matter of examples 1-3 can optionally include that the core substrate has gaps between the first and second alternate core substrates.

In example 5, the subject matter of examples 1-4 can optionally include that the gaps are filled with the dielectric layer or plugs.

In example 6, the subject matter of examples 1-5 can optionally include that the core substrate includes a plurality of PTH vias, and wherein the PTH vias couple the second conductive layer to the third conductive layer.

In example 7, the subject matter of examples 1-6 can optionally include that the first and second alternate core substrates are a stacked via laminate core substrate, a multi-laminate core substrate, a flip-chip BGA substrate, a flip-chip CSP substrate, a ceramic core substrate, or a glass core substrate.

In example 8, the subject matter of examples 1-7 can optionally include a fourth conductive layer on a bottom surface of the dielectric layer; a first resist layer over the first conductive layer and the top surface of the dielectric layer; a second resist layer under the fourth conductive layer and the bottom surface of the dielectric layer; a bridge in the dielectric layer, wherein the bridge is positioned near the top surface of the dielectric layer; and a plurality of dies over the first resist layer and the bridge, wherein the bridge couples the plurality of dies to each other, and wherein one or more of the plurality of dies are directly coupled to the first conductive layer.

In example 9, the subject matter of examples 1-8 can optionally include that the bridge may be an EMIB.

In example 10, the subject matter of examples 1-9 can optionally include that the core substrate is conductively coupled to the first alternate core substrate or the second alternate core substrate Example 11 is a semiconductor package, comprising: a first package substrate on a second package substrate; a bridge in the first package substrate; and a plurality of dies on the first package substrate, wherein the first package substrate includes a core substrate between a first alternate core substrate and a second alternate core substrate, wherein the first alternate core substrate includes a plurality of conductive layers and a plurality of vias; a dielectric layer surrounds the bridge, the core substrate, and the first and second alternate substrates, wherein the dielectric layer is over and under the core substrate and the first and second alternate substrates; a first conductive layer on a top surface of the dielectric layer; a second conductive layer on top surfaces of the core substrate and the first and second alternate substrates; and a third conductive layer on bottom surfaces of the core substrate and the first and second alternate substrates, wherein the plurality of conductive layers are coupled to the plurality of vias within the first alternate core substrate, wherein the plurality of conductive layers and vias couple the second layer to the third layer, and wherein the first alternate core substrate of the first package substrate conductively couples the plurality of dies to the second package substrate.

In example 12, the subject matter of example 11 can optionally include that the core substrate has a thickness that is substantially equal to a thickness of the first and second alternate core substrates.

In example 13, the subject matter of examples 11-12 can optionally include that the plurality of conductive layers and vias vertically extend from the bottom surface of the first alternate core substrate to the top surface of the first alternate core substrate.

In example 14, the subject matter of examples 11-13 can optionally include that the core substrate has gaps between the first and second alternate core substrates.

In example 15, the subject matter of examples 11-14 can optionally include that the gaps are filled with the dielectric layer or plugs.

In example 16, the subject matter of examples 11-15 can optionally include that the core substrate includes a plurality of PTH vias, and wherein the PTH vias couple the second conductive layer to the third conductive layer.

In example 17, the subject matter of examples 11-16 can optionally include that the first and second alternate core substrates are a stacked via laminate core substrate, a multi-laminate core substrate, a flip-chip BGA substrate, a flip-chip CSP substrate, a ceramic core substrate, or a glass core substrate.

In example 18, the subject matter of examples 11-17 can optionally include that the first package substrate further comprises: a fourth conductive layer on a bottom surface of the dielectric layer; a first resist layer over the first conductive layer and the top surface of the dielectric layer; and a second resist layer under the fourth conductive layer and the bottom surface of the dielectric layer, wherein the bridge is positioned near the top surface of the dielectric layer, wherein the plurality of dies are over the first resist layer and the bridge, wherein the bridge couples the plurality of dies to each other, and wherein one or more of the plurality of dies are directly coupled to the first conductive layer.

In example 19, the subject matter of examples 11-18 can optionally include that the bridge may be an EMIB.

In example 20, the subject matter of examples 11-19 can optionally include that the core substrate is conductively coupled to the first alternate core substrate or the second alternate core substrate.

Example 21 is a method to form a package substrate, comprising: patterning an opening through an alternate core substrate to form a first alternate core substrate and a second alternate core substrate; disposing a core substrate into the opening and between the first alternate core substrate and the second alternate core substrate, wherein the first alternate core substrate includes a plurality of conductive layers and a plurality of vias, and wherein the plurality of conductive layers are coupled to the plurality of vias within the first alternate core substrate; disposing a second conductive layer on top surfaces of the core substrate and the first and second alternate substrates; disposing a third conductive layer on bottom surfaces of the core substrate and the first and second alternate substrates, wherein the plurality of conductive layers and vias couple the second layer to the third layer; disposing a dielectric layer over and around the core substrate and the first and second alternate substrates, wherein the dielectric layer is over and under the core substrate and the first and second alternate substrates; disposing a first conductive layer on a top surface of the dielectric layer; disposing a fourth conductive layer on a bottom surface of the dielectric layer; disposing a first resist layer over the first conductive layer and the top surface of the dielectric layer; and disposing a second resist layer under the fourth conductive layer and the bottom surface of the dielectric layer.

In example 22, the subject matter of example 21 can optionally include that the core substrate has a thickness that is substantially equal to a thickness of the first and second alternate core substrates, wherein the core substrate has gaps between the first and second alternate core substrates, wherein the gaps are filled with the dielectric layer or plugs, and wherein the plurality of conductive layers and vias vertically extend from the bottom surface of the first alternate core substrate to the top surface of the first alternate core substrate.

In example 23, the subject matter of examples 21-22 can optionally include the core substrate includes a plurality of PTH vias, wherein the PTH vias couple the second conductive layer to the third conductive layer, wherein the first and second alternate core substrates are a stacked via laminate core substrate, a multi-laminate core substrate, a flip-chip BGA substrate, a flip-chip CSP substrate, a ceramic core substrate, or a glass core substrate.

In example 24, the subject matter of examples 21-23 can optionally include a bridge in the dielectric layer, wherein the bridge is positioned near the top surface of the dielectric layer; and a plurality of dies over the first resist layer and the bridge, wherein the bridge couples the plurality of dies to each other, and wherein one or more of the plurality of dies are directly coupled to the first conductive layer.

In example 25, the subject matter of examples 21-24 can optionally include the bridge may be an EMIB, and wherein the core substrate is conductively coupled to the first alternate core substrate or the second alternate core substrate.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
   a core substrate between a first alternate core substrate and a second alternate core substrate, wherein the first alternate core substrate includes a plurality of conductive layers and a plurality of vias, and wherein the second alternate core substrate does not include a conductive layer therein;
   a dielectric layer surrounding the core substrate and the first and second alternate core substrates, wherein the dielectric layer is over and under the core substrate and the first and second alternate core substrates;
   a first conductive layer on a top surface of the dielectric layer;
   a second conductive layer on top surfaces of the core substrate and the first and second alternate core substrates; and
   a third conductive layer on bottom surfaces of the core substrate and the first and second alternate core substrates, wherein the plurality of conductive layers are coupled to the plurality of vias within the first alternate core substrate, and wherein the plurality of conductive layers and vias couple the second conductive layer to the third conductive layer.

2. The package substrate of claim 1, wherein the core substrate has a thickness that is substantially equal to a thickness of the first and second alternate core substrates.

3. The package substrate of claim 1, wherein the plurality of conductive layers and vias vertically extend from the bottom surface of the first alternate core substrate to the top surface of the first alternate core substrate.

4. The package substrate of claim 1, wherein the core substrate has gaps between the first and second alternate core substrates.

5. The package substrate of claim 4, wherein the gaps are filled with the dielectric layer or plugs, and wherein the plugs include one or more organic polymer materials.

6. The package substrate of claim 1, wherein the core substrate includes a plurality of plated-through hole (PTH) vias, and wherein the PTH vias couple the second conductive layer to the third conductive layer.

7. The package substrate of claim 1, wherein the first and second alternate core substrates are a stacked via laminate core substrate, a multi-laminate core substrate, a flip-chip ball-grid array (BGA) substrate, a flip-chip chip-scale package (CSP) substrate, a ceramic core substrate, or a glass core substrate.

8. The package substrate of claim 1, further comprising:
a fourth conductive layer on a bottom surface of the dielectric layer;
a first resist layer over the first conductive layer and the top surface of the dielectric layer;
a second resist layer under the fourth conductive layer and the bottom surface of the dielectric layer;
a bridge in the dielectric layer, wherein the bridge is positioned near the top surface of the dielectric layer; and
a plurality of dies over the first resist layer and the bridge, wherein the bridge couples the plurality of dies to each other, and wherein one or more of the plurality of dies are directly coupled to the first conductive layer.

9. The package substrate of claim 8, wherein the bridge may be an embedded multi-die interconnect bridge (EMIB).

10. The package substrate of claim 1, wherein the core substrate is conductively coupled to the first alternate core substrate or the second alternate core substrate.

11. A semiconductor package, comprising:
a first package substrate on a second package substrate;
a bridge in the first package substrate; and
a plurality of dies on the first package substrate, wherein the first package substrate includes
a core substrate between a first alternate core substrate and a second alternate core substrate, wherein the first alternate core substrate includes a plurality of conductive layers and a plurality of vias;
a dielectric layer surrounding the bridge, the core substrate, and the first and second alternate core substrates, wherein the dielectric layer is over and under the core substrate and the first and second alternate core substrates;
a first conductive layer on a top surface of the dielectric layer;
a second conductive layer on top surfaces of the core substrate and the first and second alternate core substrates; and
a third conductive layer on bottom surfaces of the core substrate and the first and second alternate core substrates, wherein the plurality of conductive layers are coupled to the plurality of vias within the first alternate core substrate, wherein the plurality of conductive layers and vias couple the second conductive layer to the third conductive layer, and wherein the first alternate core substrate of the first package substrate conductively couples the plurality of dies to the second package substrate.

12. The semiconductor package of claim 11, wherein the core substrate has a thickness that is substantially equal to a thickness of the first and second alternate core substrates.

13. The semiconductor package of claim 11, wherein the plurality of conductive layers and vias vertically extend from the bottom surface of the first alternate core substrate to the top surface of the first alternate core substrate.

14. The semiconductor package of claim 11, wherein the core substrate has gaps between the first and second alternate core substrates.

15. The semiconductor package of claim 14, wherein the gaps are filled with the dielectric layer or plugs, and wherein the plugs include one or more organic polymer materials.

16. The semiconductor package of claim 11, wherein the core substrate includes a plurality of PTH vias, and wherein the PTH vias couple the second conductive layer to the third conductive layer.

17. The semiconductor package of claim 11, wherein the first and second alternate core substrates are a stacked via laminate core substrate, a multi-laminate core substrate, a flip-chip BGA substrate, a flip-chip CSP substrate, a ceramic core substrate, or a glass core substrate.

18. The semiconductor package of claim 11, wherein the first package substrate further comprises:
a fourth conductive layer on a bottom surface of the dielectric layer;
a first resist layer over the first conductive layer and the top surface of the dielectric layer; and
a second resist layer under the fourth conductive layer and the bottom surface of the dielectric layer, wherein the bridge is positioned near the top surface of the dielectric layer, wherein the plurality of dies are over the first resist layer and the bridge, wherein the bridge couples the plurality of dies to each other, and wherein one or more of the plurality of dies are directly coupled to the first conductive layer.

19. The semiconductor package of claim 11, wherein the bridge may be an EMIB.

20. The semiconductor package of claim 11, wherein the core substrate is conductively coupled to the first alternate core substrate or the second alternate core substrate.

21. A method to form a package substrate, comprising:
patterning an opening through an alternate core substrate to form a first alternate core substrate and a second alternate core substrate;
disposing a core substrate into the opening and between the first alternate core substrate and the second alternate core substrate, wherein the first alternate core substrate includes a plurality of conductive layers and a plurality of vias, wherein the plurality of conductive layers are coupled to the plurality of vias within the first alternate core substrate, and wherein the second alternate core substrate does not include a conductive layer therein;
disposing a second conductive layer on top surfaces of the core substrate and the first and second alternate core substrates;
disposing a third conductive layer on bottom surfaces of the core substrate and the first and second alternate core substrates, wherein the plurality of conductive layers and vias couple the second conductive layer to the third conductive layer;
disposing a dielectric layer over and around the core substrate and the first and second alternate core substrates, wherein the dielectric layer is over and under the core substrate and the first and second alternate core substrates;
disposing a first conductive layer on a top surface of the dielectric layer;
disposing a fourth conductive layer on a bottom surface of the dielectric layer;
disposing a first resist layer over the first conductive layer and the top surface of the dielectric layer; and
disposing a second resist layer under the fourth conductive layer and the bottom surface of the dielectric layer.

22. The method of claim 21, wherein the core substrate has a thickness that is substantially equal to a thickness of the first and second alternate core substrates, wherein the core substrate has gaps between the first and second alternate core substrates, wherein the gaps are filled with the dielectric layer or plugs, wherein the plugs include one or more organic polymer materials, and wherein the plurality of conductive layers and vias vertically extend from the bottom surface of the first alternate core substrate to the top surface of the first alternate core substrate.

23. The method of claim 21, wherein the core substrate includes a plurality of PTH vias, wherein the PTH vias couple the second conductive layer to the third conductive layer, wherein the first and second alternate core substrates are a stacked via laminate core substrate, a multi-laminate core substrate, a flip-chip BGA substrate, a flip-chip CSP substrate, a ceramic core substrate, or a glass core substrate.

24. The method of claim 21, further comprising:
  disposing a bridge in the dielectric layer, wherein the bridge is positioned near the top surface of the dielectric layer; and
  disposing a plurality of dies over the first resist layer and the bridge, wherein the bridge couples the plurality of dies to each other, and wherein one or more of the plurality of dies are directly coupled to the first conductive layer.

25. The method of claim 24, wherein the bridge may be an EMIB, and wherein the core substrate is conductively coupled to the first alternate core substrate or the second alternate core substrate.

* * * * *